(12) United States Patent
Sato

(10) Patent No.: US 7,495,428 B2
(45) Date of Patent: Feb. 24, 2009

(54) PULSE GENERATOR, TIMING GENERATOR, AND PULSE WIDTH ADJUSTING METHOD

(75) Inventor: Naoki Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 16 days.

(21) Appl. No.: 11/435,076

(22) Filed: May 16, 2006

(65) Prior Publication Data

US 2006/0267571 A1 Nov. 30, 2006

Related U.S. Application Data

(63) Continuation of application No. PCT/JP2005/015450, filed on Aug. 25, 2005.

(30) Foreign Application Priority Data

Aug. 27, 2004 (JP) ............................. 2004-249143

(51) Int. Cl.
*G06M 1/10* (2006.01)

(52) U.S. Cl. ................. 324/76.48; 324/76.62; 375/238; 327/31

(58) Field of Classification Search .............. 324/76.48, 324/76.62; 375/238; 327/31
See application file for complete search history.

(56) References Cited

U.S. PATENT DOCUMENTS

| 3,903,528 | A | * | 9/1975 | Kee ............................. | 396/244 |
| 4,223,267 | A | * | 9/1980 | Sartorius et al. ............ | 368/118 |
| 4,675,597 | A | * | 6/1987 | Hernandez ................... | 714/744 |
| 5,381,100 | A | * | 1/1995 | Hayashi ...................... | 324/601 |
| 6,148,025 | A | * | 11/2000 | Shirani et al. ............... | 375/238 |

(Continued)

FOREIGN PATENT DOCUMENTS

JP 62-188824 12/1987

(Continued)

OTHER PUBLICATIONS

Patent Abstracts of Japan, Publication No. 09-005408, Publication Date: Jan. 10, 1997, 1 page.

(Continued)

*Primary Examiner*—Diego Gutierrez
*Assistant Examiner*—Thomas F. Valone
(74) *Attorney, Agent, or Firm*—Osha • Liang LLP

(57) ABSTRACT

The present invention provides, a pulse generator, which is configured so as to generate pulses with a predetermined pulse width, comprises: multiple pulsers each of which is configured so as to adjust the pulse width of input pulses, and so as to output pulses with a predetermined pulse width thus adjusted, and which are connected in series; multiple signal acquisition units which are provided corresponding to the multiple pulsers, and each of which allows the pulses output from a corresponding one of the pulsers to be acquired at a position immediately after the output terminal of the corresponding pulser; a selection unit which allows the pulses acquired by one of the multiple signal acquisition units to be selected; a feedback path for inputting the pulses thus selected by the selection unit to the first pulser of the multiple pulsers; and a measurement unit for measuring the pulse width of the pulses thus selected by the selection unit based upon the loop cycle time of the pulse selected by the selection unit passing through the feedback path.

5 Claims, 4 Drawing Sheets

U.S. PATENT DOCUMENTS 6,246,737 B1    6/2001  Kuglin
6,586,924 B1    7/2003  Okayasu et al.
7,126,407 B2   10/2006  Furtner

FOREIGN PATENT DOCUMENTS

| | | |
|---|---|---|
| JP | 9-5408 | 1/1997 |
| WO | 0131775 | 5/2001 |
| WO | 2004038918 | 5/2004 |

OTHER PUBLICATIONS

International Search Report issued for International application No. PCT/JP2005/015450 mailed on Oct. 25, 2005 and English translation thereof, 2 pages.

European Search Report for Application No. 05 774 569.7, dated Nov. 8, 2007, 4 pages.

* cited by examiner

PULSE GENERATOR, TIMING GENERATOR, AND PULSE WIDTH ADJUSTING METHOD

CROSS-REFERENCE TO RELATED APPLICATIONS

This is a continuation application of PCT/JP2005/015450 filed on Aug. 25, 2005 which claims priority from a Japanese Patent Application(s) No. 2004-249143 filed on Aug. 27, 2004, the contents of which are incorporated herein by reference.

BACKGROUND OF THE INVENTION

1. Field of the Invention

The present invention relates to a pulse generator for generating pulses with a desired pulse width, a timing generator for generating signals with a desired frequency, and a pulse width adjustment method for adjusting the pulse width of pulses generated by a pulse generator.

2. Related Art

A conventional pulser is known for generating pulses with a desired pulse width. Such a pulser includes a delay circuit for delaying an input pulse, and a logic computation circuit for creating a pulse with a desired pulse width by performing logic computation based upon the input pulse and the delayed signal, as disclosed in FIG. 3 of Japanese Patent No. 3499051, for example.

In some cases, multiple pulsers having such a configuration are connected with one another. Such an arrangement is employed in order to prevent pulses from decaying and disappearing due to their being transmitted through a long transmission path.

Also, in some cases, a pulser is provided to the input of each of circuits connected in series, in order to adjust the pulse width of the input pulse for each input with high precision.

In such a case, there is a need to adjust the pulse width output from each pulser with high precision.

FIG. 4 is a diagram which shows an example of the configuration of a conventional pulse generator 400 including multiple pulsers. As shown in FIG. 4, in the conventional pulse generator 400 having a configuration in which multiple pulsers are connected in series, the pulse width of the pulses output from a final-stage pulser 430 is measured, and the delay amount is adjusted for each pulser. Next, description will be made regarding conventional pulse width measurement.

Upon receiving a trigger pulse, an OR circuit 470 creates a pulse. The pulse thus created is input to a pulser 410 through a fixed pulser 480 and a delay circuit 490.

Each of the pulsers 410, 420, and 430 has a function of outputting a pulse with a predetermined pulse width adjusted on the basis of the input pulse.

The output pulse output from the pulser 430 is input to the pulser 410 as a feedback signal via an exclusive OR circuit 440, a flip-flop 450, a counter 460, an OR circuit 470, the fixed pulser 480, and the delay circuit 490.

The flip-flop 450 outputs the logic high signal in response to either the rising edge or the falling edge of the input pulse. This signal thus output is supplied to the reset terminal of the flip-flop 450 via the OR circuit 470 and the fixed pulser 480, thereby setting the output of the flip-flop 450 to the logic low state. As a result, the flip-flop 450 outputs a pulse, and the pulse thus output is input to the pulser 410 as a feedback signal.

The exclusive OR circuit 440 controls whether or not the output pulse of the pulser 430 is inverted before being input to the flip-flop 450. In a case of receiving an inverted output pulse, the operation of the flip-flop 450 is delayed by a period of time corresponding to the pulse width of the output pulse thus received compared to a case of receiving a non-inverted output pulse. This allows the pulse width of the output pulse to be measured based upon the difference between the loop cycle time of an inverted output pulse and the loop cycle time of a non-inverted output pulse. Each pulse is adjusted based upon the pulse width thus measured.

However, with the conventional pulse generator 400, pulses also pass through multiple pulsers (410, 420, 430) in a case of using a pulse loop method to measure the pulse width. Such an arrangement leads to irregularities among these pulsers with respect to the delay time of the pulse rising edge and the pulse falling edge.

This leads to an error in the pulse width of the output pulse obtained based upon the difference between the loop cycle time of an inverted output pulse and the loop cycle time of a non-inverted output pulse.

In some cases, various kinds of devices may be provided between the multiple pulsers (410, 420, 430) corresponding to the usage of the pulse generator 400. Such an arrangement increases irregularities in the delay time described above, leading to a problem that the pulse width cannot be measured with high precision.

SUMMARY OF THE INVENTION

It is an object of the present invention to provide a pulse generator, a timing generator, and a pulse adjustment method for solving the aforementioned problems. This object is achieved by combining the features described in the independent claims in the Claims. Also, the dependent claims lay forth further advantageous specific examples of the present invention.

That is to say, according to a first aspect of the present invention, a pulse generator, which is configured so as to generate pulses with a predetermined pulse width, comprises: multiple pulsers each of which is configured so as to adjust the pulse width of input pulses, and so as to output pulses with a predetermined pulse width thus adjusted, and which are connected in series; multiple signal acquisition units which are provided corresponding to the multiple pulsers, and each of which allows the pulses output from a corresponding one of the pulsers to be acquired at a position immediately after the output terminal of the corresponding pulser; a selection unit which allows the pulses acquired by one of the multiple signal acquisition units to be selected; a feedback path for inputting the pulses thus selected by the selection unit to the first-stage pulser of the multiple pulsers; and a measurement unit for measuring the pulse width of the pulses thus selected by the selection unit based upon the loop cycle time of the pulse selected by the selection unit passing through the feedback path.

Each of the signal acquisition unit may include an edge switching unit for switching the pulse output mode between a mode in which the pulses are output inverted, and a mode in which the pulses are output without being inverted. The measurement unit may measure the pulse width of the pulses based upon the difference in the loop cycle time between a case in which the edge switching unit supplies the inverted pulses, and a case in which the edge switching unit supplies the non-inverted pulses.

The multiple pulsers may be connected in series via device components having delay time that changes corresponding to whether the rising pulse edge or the falling pulse edge passes through. With such an arrangement, each of the signal acquisition units may acquire the pulses from the output terminal of a corresponding one of the pulsers without involving the device components.

The selection unit may select the pulses acquired from each of the multiple signal acquisition units in order, from the first-stage pulser to the final-stage pulser. With such an arrangement, the measurement unit may measure the pulse width of the pulses every time that the selection unit selects the pulses. Furthermore, the pulse generator may further comprise an adjusting unit having a function of controlling the corresponding pulser so as to adjust the pulse width of the pulses output from the pulser.

According to a second aspect of the present invention, a timing generator, which is configured so as to generate a timing signal with a predetermined cycle, comprises: a set/reset latch having a function of creating the rising edge of the timing signal according to an input set signal, and a function of creating the falling edge of the timing signal according to an input reset signal; a set unit for supplying the set signal to the set/reset latch; and a reset unit for supplying the reset signal to the set/reset latch. With such an arrangement, the set unit comprises: a first variable delay circuit for outputting a first set signal obtained by delaying an input reference clock; a second variable delay circuit for delaying the input reference clock and outputting a second set signal, the second set signal having a phase which differs from the phase of the first set signal by a phase difference equal to or smaller than the cycle of the reference clock; first-stage pulsers for adjusting the pulse width of the signals output from the first variable delay circuit and the pulse width of the signals output from the second variable delay circuit so as to output pulses with predetermined pulse widths; an OR circuit for creating the logical sum of the first set signal and the second set signal as the set signal; a third variable delay circuit for delaying the set signal output from the logical-add circuit, and outputting the signal thus delayed; a second-stage pulser for adjusting the pulse width of the signal output from the third variable delay circuit so as to output pulses with a predetermined pulse width; a first signal acquisition unit that is provided to the first-stage pulser so as to allow the pulses output from the first-stage pulser to be acquired at the position immediately after the output terminal of the first-stage pulser; a second signal acquisition unit that is provided to the second-stage pulser so as to allow the pulses output from the second-stage pulser to be acquired at the position immediately after the output terminal of the second-stage pulser; a selection unit for selecting the pulses acquired from one of the first signal acquisition unit and the second signal acquisition unit; a feedback path for inputting to the first-stage pulser the pulses selected by the selection unit; and a measurement unit for measuring the pulse width of the pulses selected by the selection unit, based upon the loop cycle time of the pulse selected by the selection unit passing through the feedback path.

According to a third aspect of the present invention, a pulse width adjustment method is provided for adjusting the pulse width of each of multiple pulsers each of which has a function of adjusting the pulse width of an input pulse so as to output a pulse with a predetermined pulse width, and which are connected in series. The aforementioned pulse width adjustment method comprises: a signal acquisition step for acquiring the pulse output from each of the multiple pulsers at a position immediately after the output terminal thereof; a selection step for selecting one of the pulses acquired in the signal acquisition step; a feedback step for inputting the pulse selected in the selection step, to the first-stage pulser of the multiple pulsers as a feedback signal; and a measurement step for measuring the pulse width of the pulse selected in the selection step based upon the loop cycle time of the pulse selected in the selection step passing through the feedback path.

Note that the above overview of the invention is not a comprehensive listing of all essential features of the present invention, and that sub-combinations of these feature groups may also be encompassed by the invention.

DETAILED DESCRIPTION OF THE INVENTION

The present invention will now be described by way of embodiments; however, it should be understood that the following embodiments do not restrict the invention according to the Claims, and that combinations of features described in the embodiments are not necessarily indispensable to the present invention.

Figure 1:
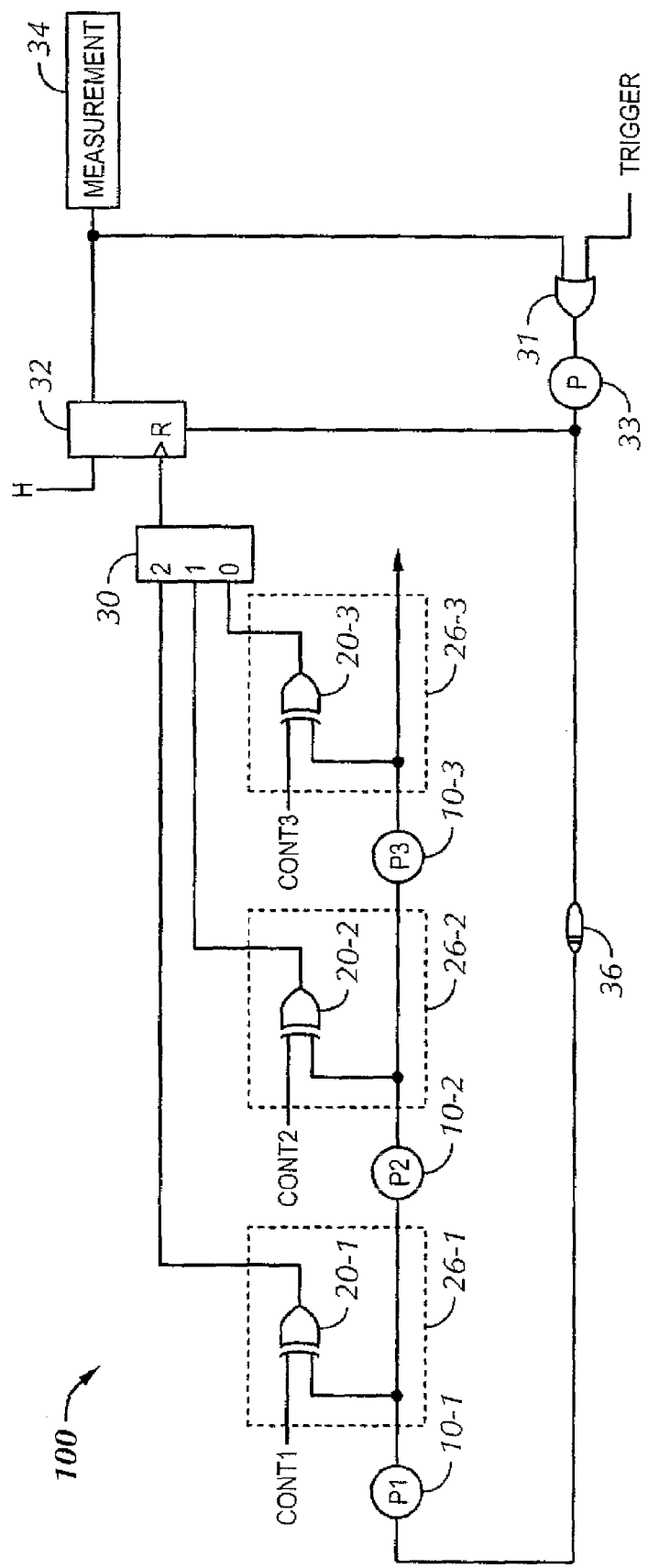
FIG. 1 is a diagram which shows an example of the configuration of a pulse generator 100 according to an embodiment of the present invention.

FIG. 1 is a diagram which shows an example of the configuration of a pulse generator 100 according to an embodiment of the present invention. The pulse generator 100 is a circuit for generating pulses with a predetermined pulse width. The pulse generator 100 includes: multiple pulsers 10-1, 10-2, and 10-3 (which will collectively be referred to as "pulsers 10" hereafter); multiple signal acquisition units 26-1, 26-2, and 26-3 (which will collectively be referred to as "signal acquisition units 26" hereafter); a selection unit 30, a flip-flop 32; a measurement unit 34; an OR circuit 31; a fixed pulser 33; and a delay circuit 36.

Furthermore, the pulse generator 100 has a function of measuring and adjusting the pulse width of each of the pulsers 10.

Upon receiving a trigger pulse for generating pulses, the OR circuit 31 inputs this pulse to the fixed pulser 33. The fixed pulser 33 generates a pulse with a predetermined pulse width corresponding to the trigger pulse. The pulse thus generated is input to the pulser 10-1 which is the first-stage pulser of the multiple pulsers 10, via the delay circuit 36.

Each of the multiple pulsers 10 may be a differential pulser having a function as follows. That is to say, with such a differential pulser, the input pulse is delayed corresponding to the desired pulse width, and the delayed pulse is inverted. Then, the logical product of the inverted pulse and the input pulse is computed, thereby generating a pulse with the desired pulse width. Also, each of the multiple pulsers 10 may be an integral pulser having a function as follows. That is to say, with such an integral pulser, the input pulse is delayed corresponding to the desired pulse width, and the logical sum of the delayed pulse and the input pulse is computed, thereby generating a pulse with the desired pulse width.

Each of the multiple pulsers 10 adjusts the input pulse so as to output a pulse with a predetermined pulse width. The pulse thus output is input to the next-stage pulser. The output pulse output from the final-stage pulser 10-3 is output from the pulse generator 100.

Next, description will be made regarding measurement and adjustment of the pulse width for each of the pulsers 10. Each of the multiple signal acquisition units 26 acquires pulses output from the corresponding one of the pursers 10 at a position immediately after the output terminal thereof. Each of the signal acquisition units 26 includes a transmission line connected to the output terminal of the corresponding pulser 10, and one of edge switching units 20-1, 20-2, or 20-3 where pulses are input via the aforementioned transmission line. Each of edge switching units 20-1, 20-2, and 20-3 receives a control signal (CONT 1, 2, or 3) which controls whether the pulse output from the corresponding pulser 10 is inverted or not, and switches the output mode between a mode in which the inverse of the pulse output from the pulser 10 is output and a mode in which the pulse output therefrom is output without being inverted. In the present example, edge switching units 20-1, 20-2, and 20-3 are an exclusive OR circuit.

The selection unit 30 selects the pulse acquired by one of the multiple signal acquisition units 26. That is to say, the selection unit 30 selects the pulse acquired by the signal acquisition unit 26 corresponding to the pulser 10 for which the pulse width of the output pulse is to be measured. Furthermore, the flip-flop 32, the OR circuit 31, the fixed pulser 33, and the delay circuit 36 form a feedback circuit. With such a feedback circuit, the pulse selected by the selection unit 30 is input to the first-stage pulser 10-1 of the series of multiple pulsers 10 as a feedback signal.

The flip-flop 32 outputs the logic high signal in response to either the rising edge or the falling edge of the pulse selected by the selection unit 30. The OR circuit 31 outputs the logical sum of the signal output from the flip-flop 32 and the input trigger pulse. Also, the logic high signal output from the flip-flop 32 is supplied to the reset terminal of the flip-flop 32 via the OR circuit 31 and the fixed pulser 33. Thus, the flip-flop 32 outputs pulses with a pulse width corresponding to the transmission time of this logic high signal. With such an arrangement, the measurement unit 34 measures the pulse width of the pulse selected by the selection unit 30 based upon the loop cycle time in which the pulse passes through the aforementioned feedback circuit. The measurement unit 34 may include a counter for counting the number of pulses passing through the aforementioned feedback circuit during a predetermined period of time.

The measurement unit 34 may control and instruct the selection unit 30 to select the pulses output from one of the pulsers 10. Furthermore, the measurement unit 34 may supply a control signal to edge switching units 20-1, 20-2, and 20-3 such that the pulse width of the pulse can be measured based upon the difference between the loop cycle time in a case of supplying an inverted pulse and the loop cycle time in a case of supplying a non-inverted pulse.

With the pulse generator 100 according to the present embodiment, the output pulse is acquired at a position immediately after the output terminal for each pulser 10, and the pulse width of the pulse is measured with a pulse loop method. This reduces pulse width measurement error arising from the difference in delay time between the pulse rising edge and the pulse falling edge.

Figure 2:
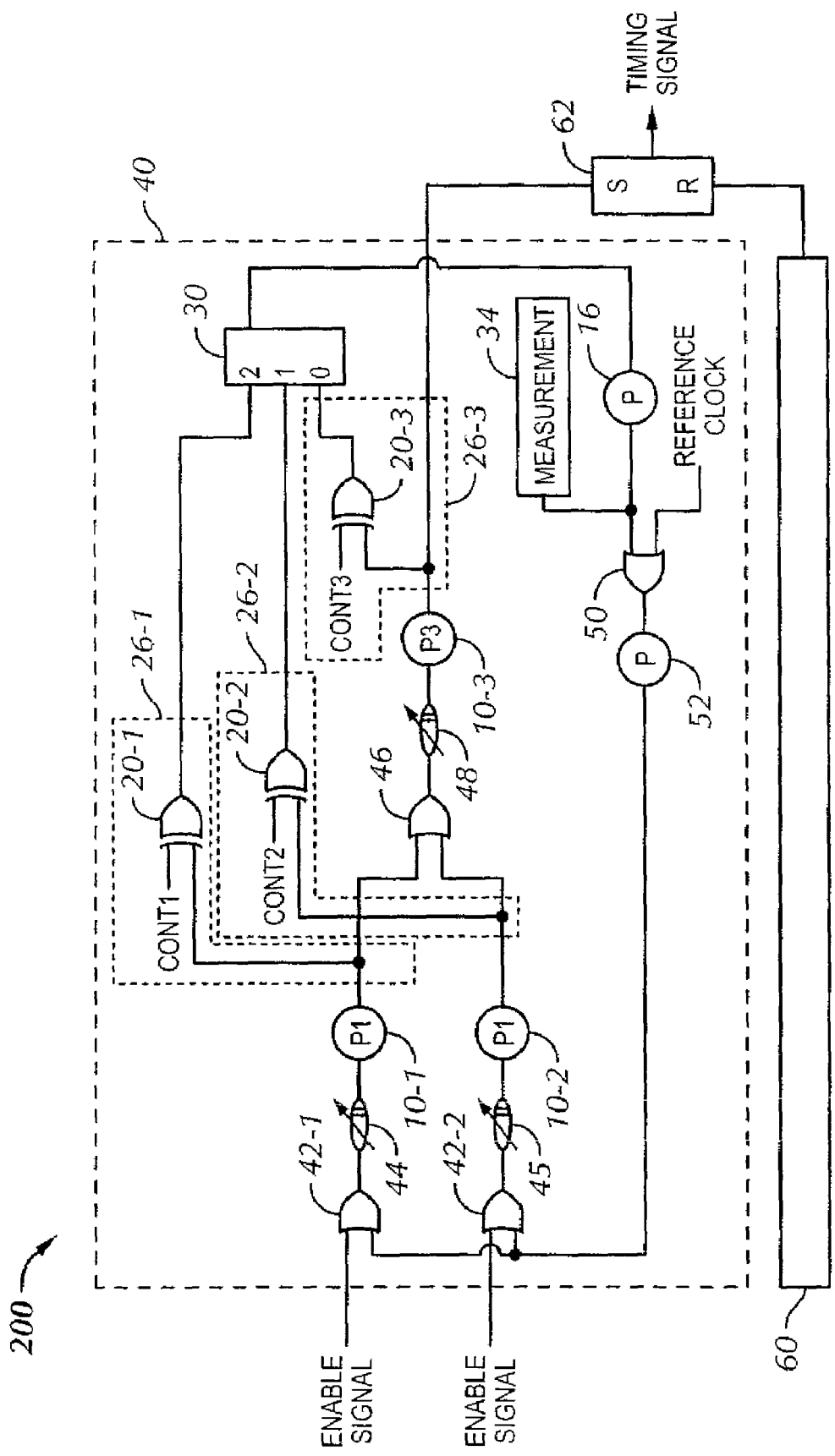
FIG. 2 is a diagram which shows an example of the configuration of a timing generator 200 according to another embodiment of the present invention.

Also, the pulsers 10 may be connected in series through device components having a function of changing the delay time corresponding to whether a rising pulse edge or a falling pulse edge passes through, as shown in FIG. 2 described later. In such a case, each signal acquisition unit 26 preferably acquires output pulses from the output terminal of the corresponding pulser 10 without involving such a device component.

On the other hand, the selection unit 30 preferably selects the output pulses acquired by the multiple signal acquisition units 26 in order, i.e., the pulses output from the first-stage pulser 10-1 through the output pulses output from the final-stage pulser 10-1, in that order. In this case, the measurement unit 34 measures the pulse width of the pulse thus selected every time the selection unit 30 selects the pulse output from one of the pulsers. The pulse generator 100 preferably includes an adjustment unit for adjusting the pulse width of the output pulses output from each pulser 10 by controlling the corresponding pulser 10 every time the measurement unit 34 measures the pulse width of the output pulses. With the present embodiment, the measurement unit 34 also serves as such an adjustment unit.

As described above, with the present embodiment, the pulse width is adjusted for each pulser in order beginning with the first-stage pulser 10-1. This enables the pulse width of each pulser 10 to be adjusted with high precision.

Also, each pulser 10 may have a path for outputting the input pulses with an adjusted pulse width and a path for allowing the input pulses to pass through without adjustment. With such an arrangement, the output pulse may be output via a desired path selected from these paths.

With such an arrangement, the measurement unit 34 may instruct the pulsers 10, which are provided upstream from the pulser 10 of which the pulse width is to be measured, to select the path which allows the input pulses to pass through without adjustment.

Such a path, which allows the input pulses to pass through without adjustment, preferably includes no device component in which the delay time is changed according to whether a rising pulse edge or a falling pulse edge passes through.

FIG. 2 is a diagram which shows an example of the configuration of a timing generator 200 according to another embodiment of the present invention. The timing generator 200 is a circuit for generating a timing signal with a predetermined cycle. The timing generator 200 includes a set/reset latch 62, a set unit 40, and a reset unit 60.

The set/reset latch 62 creates the rising edge of a timing signal according to a set signal received from the set unit 40. Also, the set/reset latch 62 creates the falling edge of a timing signal according to a reset signal received from the reset unit 60.

The set unit 40 and the reset unit 60 have generally the same configuration, and generate the set signal and the reset signal with a predetermined phase difference.

Description will be made in the present embodiment regarding the configuration of the set unit 40.

The set unit 40 includes: two AND circuits 42-1 and 42-2; a first variable delay circuit 44, a second variable delay circuit 45, two first-stage pulsers 10-1 and 10-2; two first signal acquisition units 26-1 and 26-2; an OR circuit 46; a third variable delay circuit 48; a second-stage pulser 10-3; a second signal acquisition unit 26-3; a selection unit 30; a fixed pulser 16; a measurement unit 34; an OR circuit 50; and a pre-pulser 52.

The first variable delay circuit 44 outputs a first set signal by delaying an input reference clock. On the other hand, the second variable delay circuit 45 is provided in parallel with the first variable delay circuit. The second variable delay circuit 45 outputs a second set signal with a phase shifted from the phase of the first set signal by an amount which is equal to or smaller than the cycle of the reference clock.

The input terminals of the first variable delay circuit 44 and the second variable delay circuit 45 are connected to the respective AND circuits 42-1 and 42-2. Each AND circuit 42-1 and 42-2 receives the reference clock and an enable signal, and outputs the logical product of these signals. In a case of generating a timing signal, or in a case of performing pulse-width measurement for each pulser, the logical-high enable signal is supplied to AND circuits 42-1 and 42-2.

On the other hand, the output terminals of the first variable delay circuit 44 and the second variable delay circuit 45 are connected to the respective first-stage pulsers 10-1 and 10-2. Each first-stage pulser 10-1 and 10-2 adjusts the pulse width output from the first variable delay circuit 44 or the second variable delay circuit 45 so as to output a pulse signal with a predetermined pulse width.

The OR circuit 46 creates the logical sum of the first set signal output from the first variable delay circuit 44 and the second set signal output from the second variable delay circuit 45, and outputs the signal thus created, as a set signal. The third variable delay circuit 48 delays the set signal output from the OR circuit 46, and outputs the signal thus delayed. The third variable delay circuit 48 receives a delay setting signal corresponding to the phase difference between the set signal and the reset signal which are to be input to the set/reset latch 62.

On the other hand, the second-stage pulser 10-3 adjusts the pulse width output from the third variable delay circuit 48 so as to output a pulse signal with a predetermined pulse width to the set/reset latch 62. With such an arrangement, the high-frequency set signal and reset signal generated based upon the reference clock are interleaved, thereby creating a timing signal with a desired pattern.

On the other hand, such an arrangement requires each pulser to output pulses with a pulse width satisfying an adjacent pulse limitation condition in order to prevent these pulses from coupling with one another. Accordingly, there is a need to adjust the pulse width with high precision for each pulser. With the timing generator 200 according to the present embodiment, the pulse width is measured and adjusted for each of the first-stage pulsers 10-1 and 10-2 and the second-stage pulser 10-3 in the same way as with the pulse generator 100 described with reference to FIG. 1. In a case of measuring the pulse width, first, the OR circuit 50 receives a trigger pulse for measurement, instead of the reference clock. The trigger pulse thus received is input to the AND circuits 42-1 and 42-2.

The first signal acquisition unit 26-1 is provided corresponding to the first-stage pulser 10-1. The first signal acquisition unit 26-1 acquires output pulses output from the first-stage pulser 10-1, at a position immediately after the output terminal of the first-stage pulser 10-1. On the other hand, the second acquisition unit 26-2 is provided corresponding to the second-stage pulser 10-2. The second signal acquisition unit 26-2 acquires output pulses output from the second-stage pulser 10-2, at a position immediately after the output terminal of the second-stage pulser 10-2. The first signal acquisition unit 26-1 and the second signal acquisition unit 26-2 have the same configuration and the same function as those of the signal acquisition unit 26 described with reference to FIG. 1.

The selection unit 30 selects the pulse output from one of three signal acquisition units, i.e., the first signal acquisition units 26-1 and the second signal acquisition unit 26-2. The selection unit 30 has the same function as that of the selection unit 30 described with reference to FIG. 1. Furthermore, the fixed pulser 16, the OR circuit 50, and the pre-pulser 52 form a feedback path for inputting the pulse thus selected by the selection unit 30 to each of the first-stage pulsers 10-1 and 10-2 as a feedback signal.

The measurement unit 34 measures the pulse width of the pulse selected by the selection unit 30, based upon the loop cycle time of the pulse selected by the selection unit 30 passing through the feedback path.

The measurement unit 34 may measure and adjust the pulse width for each pulser in the same way as with the measurement unit 34 described with reference to FIG. 1. For example, first, the pulse width is measured and adjusted for the first-stage pulser 10-1. Then, the pulse width is measured and adjusted for the second-stage pulser 10-2. Irregularities arise in the delay time of the pulse rising edge and the pulse falling edge in the use of delay circuits and logical computation circuits.

The timing generator 200 according to the present embodiment enables the pulse width to be measured and to be adjusted with high precision for each pulser even in a case that multiple pulsers are connected via such device components.

Figure 3:
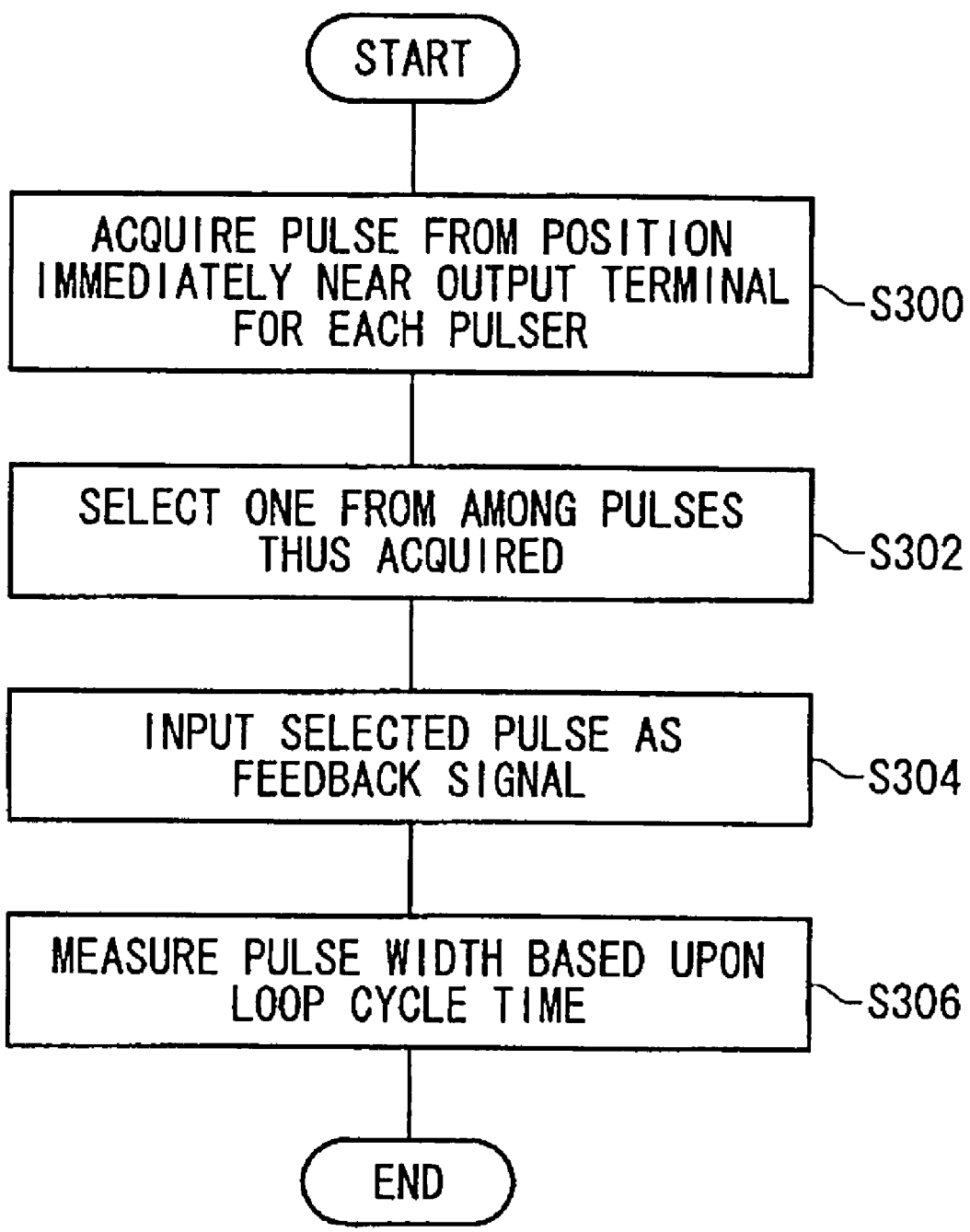
FIG. 3 is a flowchart which shows an example of a pulse width adjustment method for adjusting the pulse width of pulses output from each pulser 10 included in the pulse generator 100 described with reference to FIG. 1.
Figure 4:
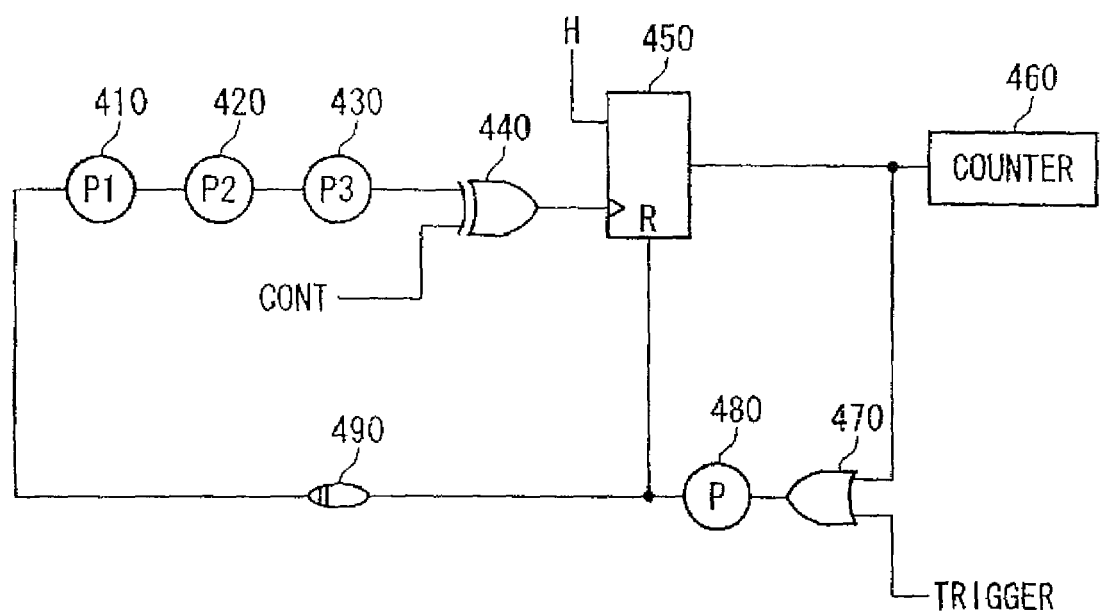
FIG. 4 is a diagram which shows an example of the configuration of a conventional pulse generator 400 having multiple pursers.

FIG. 3 is a flowchart which shows an example of a pulse width adjustment method for adjusting the pulse width of pulses output from each pulser 10 included in the pulse generator 100 described with reference to FIG. 1. First, the output pulse output from each pulser 10 is acquired at a position immediately after the output terminal of the corresponding one of the multiple pulsers 10 (signal acquisition step S300).

Next, one of the output pulses acquired in signal acquisition step S300 is selected (selection step S302). Subsequently, the output pulse thus selected in selection step S302 is input to the first-stage pulser of the multiple pulsers 10 as a feedback signal (feedback step S304). Then, the pulse width of the output pulse thus selected in selection step S302 is measured based upon the loop cycle time of the output pulse thus selected in selection step S302 passing through the feedback path (measurement step S306).

While the present invention has been described thus by way of embodiments, the technical scope of the present invention is not restricted to the scope of the embodiments described above. Various modifications and improvements may be made to the above-described embodiments. It is to be clearly understood from the Claims that such modifications and improvements are also encompassed within the technical scope of the present invention.

As can be clearly understood from the above description, the present invention provides pulse-width measurement which enables the pulse width of the output pulses output from each of multiple pulsers connected in series to be measured with high precision using a pulse loop method.

What is claimed is:

1. A pulse generator for generating pulses with a predetermined pulse width, said pulse generator comprising:

a plurality of pulsers connected in series, for each of which is configured so as to adjusting the pulse width of input pulses, and so as to output pulses with a predetermined pulse width thus adjusted, respectively and which are connected in series;

a plurality of signal acquisition units which are provided corresponding to said plurality of pulsers, and each of which allows said pulses output from a corresponding one of said pulsers to be acquired from the output terminal of said corresponding pulser, wherein the plurality of pulsers comprises a first-stage pulser and a final-stage pulser;

a selection unit which selects one of said pulses acquired by one of said plurality of signal acquisition units;

a feedback path for inputting the pulses thus selected by said selection unit to the first-stage pulser of said plurality of pulsers; and a measurement unit for measuring the pulse width of the pulses thus selected by said selection unit based upon the loop cycle time of the pulse selected by said election unit passing through said feedback path;

wherein when said selection unit selects the pulse acquired by one of the plurality of pulsers, the feedback path is formed without passing through any latter-stage pulser than a stage of the selected one pulser, and said selection unit selects the pulses acquired from each of the plurality of signal acquisition units in order, from the first-stage pulser to the final-stage pulser.

2. The pulse generator according to claim 1,
wherein each of said signal acquisition unit includes an edge switching unit for switching the pulse output mode between a mode in which said pulses are output inverted, and a mode in which said pulses are output without being inverted; and wherein said measurement unit measures the pulse width of said pulses based upon the difference in said loop cycle time between when said edge switching unit supplies an inverted pulse, and a case in which said edge switching unit supplies a non-inverted pulse.

3. The pulse generator according to claim 2,
wherein said plurality of pulsers are connected in series via device components having delay time that changes corresponding to whether the rising pulse edge or the falling pulse edge passes through, and wherein each of said signal acquisition units acquires said pulses from the output terminal of a corresponding one of said pulsers without involving said device components.

4. The pulse generator according to claim 1,
wherein said selection unit selects said pulses acquired from each of said plurality of signal acquisition units in order, from the first-stage pulser to the final-stage pulser, and wherein said measurement unit measures the pulse width of said pulses every time that said selection unit selects said pulses, and wherein said pulse generator further comprises an adjusting unit having a function of controlling said corresponding pulser so as to adjust the pulse width of said pulses output from said pulser.

5. A pulse width measurement method for measuring a pulse width of each of a plurality of pulsers each of which has a function of adjusting the pulse width of an input pulse so as to output a pulse with a predetermined pulse width, and which are connected in series, said pulse width adjustment method comprising:

a signal acquisition step for acquiring said pulse output from each of said plurality of pulsers from the output terminal thereof;

a selection step for selecting one of said pulses acquired in said signal acquisition step;

a feedback step for inputting said pulse selected in said selection step, to a first-stage pulser of said plurality of pulsers as a feedback signal; and a measurement step for measuring the pulse width of the pulse selected in said selection step based upon a loop cycle time of the pulse selected in said selection step passing through said feedback path;

wherein when said selection unit selects the pulse acquired by one of the plurality of pulsers, the feedback path is formed without passing through any latter-stage pulser than a stage of the selected one pulser, and said selection unit selects the pulses acquired from each of the plurality of signal acquisition units in order, from the first-stage pulser to the final-stage pulser.

* * * * *